(12) United States Patent
Hargrove et al.

(10) Patent No.: US 8,026,539 B2
(45) Date of Patent: Sep. 27, 2011

(54) METAL OXIDE SEMICONDUCTOR DEVICES HAVING DOPED SILICON-COMPROMISING CAPPING LAYERS AND METHODS FOR FABRICATING THE SAME

(75) Inventors: Michael Hargrove, Clinton Corners, NY (US); Frank Bin Yang, Mahwah, NJ (US); Rohit Pal, Fishkill, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 12 days.

(21) Appl. No.: 12/388,094

(22) Filed: Feb. 18, 2009

(65) Prior Publication Data

US 2010/0207176 A1    Aug. 19, 2010

(51) Int. Cl.
*H01L 29/76* (2006.01)

(52) U.S. Cl. ............ 257/288; 257/412; 257/E21.202; 257/E21.204; 438/591; 438/592

(58) Field of Classification Search ........... 438/592, 438/591; 257/E21.201–E21.204
See application file for complete search history.

(56) References Cited

U.S. PATENT DOCUMENTS

| | | | |
|---|---|---|---|
| 5,885,887 A * | 3/1999 | Hause et al. | 438/564 |
| 2003/0129793 A1 | 7/2003 | Chau et al. | |
| 2004/0033653 A1 * | 2/2004 | Kim et al. | 438/202 |
| 2005/0282341 A1 | 12/2005 | Park et al. | |
| 2006/0084220 A1 * | 4/2006 | Lim et al. | 438/216 |
| 2006/0166424 A1 * | 7/2006 | Schaeffer et al. | 438/199 |
| 2006/0237803 A1 | 10/2006 | Zhu et al. | |
| 2007/0032009 A1 * | 2/2007 | Currie et al. | 438/199 |
| 2007/0148838 A1 * | 6/2007 | Doris et al. | 438/197 |
| 2007/0178634 A1 * | 8/2007 | Jung et al. | 438/199 |
| 2007/0262348 A1 * | 11/2007 | Park et al. | 257/204 |
| 2008/0191292 A1 * | 8/2008 | Callegari et al. | 257/411 |
| 2009/0101984 A1 * | 4/2009 | Lee et al. | 257/369 |
| 2010/0084718 A1 * | 4/2010 | Liu et al. | 257/410 |

OTHER PUBLICATIONS

Chau, Robert, et al. "Application of High-k Gate Dielectrics and Metal Gate Electrodes to Enable Silicon and Non-Silicon Logic Nanotechnology," Microelectronic Engineering, Jun. 2005, pp. 1-6, vol. 80, Issue 1, Elsevier Science Ltd., Oxford UK. ISSN:0167-9317.
Gusev, E.P., et al. "Advanced High-k Dielectric Stacks with PolySi and Metal Gates: Recent Progress and Current Challenges," IBM Journal of Research and Development, Advanced Silicon Technology, Aug. 6, 2006, pp. 387-410, vol. 50, No. 4/5. http://www.research.ibm.com/journal/rd/504/gusev.html.
PCT Search Report for PCT/US2010/023489 mailed Jul. 15, 2010.

* cited by examiner

*Primary Examiner* — Ha Tran Nguyen
*Assistant Examiner* — Shaka Scarlett
(74) *Attorney, Agent, or Firm* — Ingrassia Fisher & Lorenz, P.C.

(57) ABSTRACT

Methods are provided for forming a semiconductor device comprising a semiconductor substrate. In accordance with an exemplary embodiment, a method comprises the steps of forming a high-k dielectric layer overlying the semiconductor substrate, forming a metal-comprising gate layer overlying the high-k dielectric layer, forming a doped silicon-comprising capping layer overlying the metal-comprising gate layer, and depositing a silicon-comprising gate layer overlying the doped silicon-comprising capping layer.

23 Claims, 9 Drawing Sheets

METAL OXIDE SEMICONDUCTOR DEVICES HAVING DOPED SILICON-COMPROMISING CAPPING LAYERS AND METHODS FOR FABRICATING THE SAME

FIELD OF THE INVENTION

The present invention generally relates to semiconductor devices and methods for fabricating semiconductor devices, and more particularly relates to metal oxide semiconductor devices having doped silicon-comprising capping layers and methods for fabricating such metal oxide semiconductor devices.

BACKGROUND OF THE INVENTION

The majority of present day integrated circuits (ICs) are implemented by using a plurality of interconnected field effect transistors (FETs), also called metal oxide semiconductor field effect transistors (MOSFETs or MOS transistors). The ICs are usually formed using both P-channel and N-channel FETs in which case the IC is referred to as a complementary MOS or CMOS IC. There is a continuing trend to incorporate more circuitry having greater complexity on a single IC chip. To continue this trend, the size of each individual device in the circuit and the spacing between device elements, or the pitch, is reduced for each new technology generation.

As critical dimensions shrink, device components such as the gate length and the thickness of gate insulator layers are scaled down in substantial proportion with each generation. For the 65 nm technology generation, conventional gate insulator materials such as, for example, thermally grown silicon dioxide ($SiO_2$) or deposited silicon oxynitride (SiON), when used alone, begin to exhibit excessive leakage current and thus provide only marginally sufficient electrical isolation between the gate electrode and the underlying channel of a transistor. Therefore, alternative materials having dielectric constants greater than about 7 (referred to herein as high-k dielectrics) have been considered for use with advanced devices including advanced CMOS devices. Gate insulators made from high-k dielectrics can be made thicker than those made with $SiO_2$ or SiON without sacrificing capacitance, and thus offer the benefit of a significant reduction in leakage current. Candidate materials include transitional metal oxides, silicates, and oxynitrides such as hafnium oxides, hafnium silicates, and hafnium oxynitrides.

However, combining high-k dielectric insulators with traditional polycrystalline silicon gate electrodes often results in transistors having a higher than optimal threshold voltage ($V_t$), and channel mobility and drive current that are undesirably low for advanced devices including those of the 45 nm generation. Investigators have proposed that the resulting high $V_t$ is related to defects at the high-k/polycrystalline silicon interface. Further, it has been proposed that the reduction in channel mobility is primarily the result of surface phonon scattering in high-k dielectric materials. To overcome this incompatibility, gate electrode layers fabricated from such metals as titanium nitride (TiN) have been inserted between high-k insulators and polycrystalline silicon electrodes in the gate stacks of high performance transistors. Such metal gates are effective in mitigating phonon scattering caused by high-k dielectrics in the channel region resulting in improved drive current. Metal gates thereby overcome the problems associated with high-k dielectrics used as gate insulators and thus enable further scalability to smaller critical dimensions by utilizing the inherently superior insulation these materials provide.

The effort to optimize the performance of polycrystalline silicon/metal composite gate electrode devices has led to an investigation into the composition and associated work function of the metallic component of such gate electrodes. For example, it has been demonstrated that using a metal gate having an optimized composition and work function can result in a transistor that operates at or near a desired $V_t$. Further, when metal layers are added to polycrystalline silicon electrodes, device performance characteristics such as channel drive current are improved because of the low resistance of such gates when operating in a direct current (DC) mode. However, when operating in an alternating current (AC) mode, the AC gate impedance of such devices has been shown to be unacceptably high. It has been proposed that high gate impedance may be the result of defects within the gate electrode at the metal/polycrystalline silicon interface. High AC gate impedance can adversely affect device performance by degrading the switching speed, and thus the frequency at which a transistor device may be operated.

Accordingly, it is desirable to provide semiconductor devices having doped silicon-comprising capping layers interposed between metal and polycrystalline silicon layers of a composite gate electrode to reduce the AC impedance of such gates. Further it is also desirable to provide methods for fabricating such semiconductor devices. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

Methods are provided for forming a semiconductor device comprising a semiconductor substrate. In accordance with one embodiment, the method comprises the steps of forming a high-k dielectric layer overlying the semiconductor substrate, forming a metal-comprising gate layer overlying the high-k dielectric layer, forming a doped silicon-comprising capping layer overlying the metal-comprising gate layer, and depositing a silicon-comprising gate layer overlying the doped silicon-comprising capping layer.

In accordance with another exemplary embodiment, a further method is provided for fabricating a semiconductor device on a semiconductor substrate having a first region and a second region. The method comprises the steps of forming a channel layer comprising a compressively-stressed semiconductor material overlying the second region of the semiconductor substrate, forming a high-k dielectric layer overlying the first region of the semiconductor substrate and the channel layer, depositing a metal-comprising gate layer overlying the high-k dielectric layer, forming a doped silicon capping layer overlying the metal-comprising gate layer, forming a silicon-comprising gate layer overlying the doped silicon capping layer, and heating the substrate.

A semiconductor device is provided having a gate stack overlying a semiconductor substrate. In accordance with another exemplary embodiment, the gate stack comprises a high-k dielectric layer disposed overlying the semiconductor substrate, a metal-comprising gate layer disposed overlying the high-k dielectric layer, a doped silicon capping layer disposed overlying the metal-comprising gate layer, and a silicon-comprising gate layer overlying the doped silicon capping layer.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

The various embodiments of the present invention describe methods for fabricating NMOS and PMOS transistors (NFETs and PFETs) having gate electrodes with doped silicon or doped metal silicide capping layers to reduce gate impedance in such devices. In these embodiments, these methods include forming a doped silicon capping layer interposed between metal and polycrystalline silicon gate electrode layers of a composite transistor gate stack. The doped silicon capping layer provides a conductive transitional layer that reduces defects at this interface believed to be a cause of undesirably high gate impedance. In some of these embodiments, the doped silicon capping layer is used in conjunction with a silicide-forming metal capping layer interposed between the doped silicon capping and polycrystalline silicon gate layers. When the substrate is sufficiently heated during subsequent processing, the doped silicon capping and silicide-forming metal capping layers react to form a layer of metal silicide. Such a metal silicide layer also reduces interfacial defects and further increases the conductivity of the gate electrode. A metal silicide capping layer structure may therefore further reduce gate impedance below a level achievable using a doped silicon capping layer alone.

FIGS. 1-9 illustrate schematically, in cross-section, a portion of a semiconductor MOS transistor device 10 and methods for fabricating such a semiconductor device in accordance with exemplary embodiments of the invention. The embodiments herein described apply to N-channel MOS (NMOS) and to P-channel MOS (PMOS) transistors unless it is specified that an embodiment applies only to one of these. While the fabrication of one MOS transistor is illustrated in FIGS. 1-9, it will be appreciated that the methods depicted can be used to fabricate any number of such transistors. Various steps in the manufacture of MOS components are well known and so, in the interest of brevity, many conventional steps will only be mentioned briefly herein or will be omitted entirely without providing the well known process details.

Figure 1:
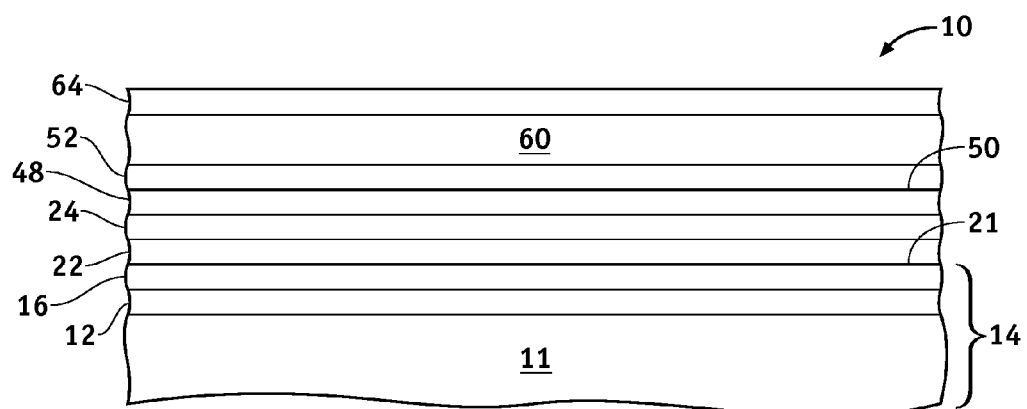
FIGS. 1-9 illustrate schematically, in cross-section, a portion of a semiconductor device and methods for fabricating such a semiconductor device having a doped silicon-comprising capping layer in accordance with an exemplary embodiment of the present invention.

Referring to FIG. 1, the method begins by providing a semiconductor substrate 14 on and within which semiconductor device 10 will subsequently be formed. The semiconductor substrate can be silicon, germanium, a III-V material such as gallium arsenide, or other semiconductor material. Semiconductor substrate 14 will hereinafter be referred to for convenience, but without limitation, as a silicon substrate. The term "silicon substrate" is used herein to encompass the relatively pure silicon materials typically used in the semiconductor industry as well as silicon admixed with other elements such as germanium, carbon, and the like. The silicon substrate may be a bulk silicon wafer or, as illustrated, may be a thin layer of silicon 16 on an insulating layer 12 (commonly know as silicon-on-insulator, or SOI) that, in turn, is supported by a carrier wafer 11. At least a surface portion of silicon substrate 14 is impurity doped, for example by forming N-type well regions and P-type well regions for the fabrication of P-channel (PMOS) transistors and N-channel (NMOS) transistors, respectively.

A gate insulator layer 22 is formed overlying silicon substrate 14. Typically, gate insulator layer 22 can be a layer of silicon dioxide ($SiO_2$) thermally grown on surface 21 of thin silicon layer 16. Alternatively, and for other types of semiconductor substrates, gate insulator layer 22 may be a deposited layer of a silicon oxide ($SiO_x$) where x is a number greater than zero, silicon nitride, or silicon oxynitride. Deposited films of silicon nitride and silicon oxynitride may be stoichiometric or non-stoichiometric in composition, but in either case, such films will be hereinafter referred to for convenience as $Si_3N_4$ and SiON, respectively. Gate insulator layers can be deposited, for example, by chemical vapor deposition (CVD), low pressure chemical vapor deposition (LPCVD), or plasma enhanced chemical vapor deposition (PECVD) processes. Gate insulator layer 22 is preferably formed of a blanket-deposited SiON layer and has a thickness in a range of from about 0.8 nanometers (nm) to about 1.2 nm, and is preferably about 0.8 nm thick.

Still referring to FIG. 1, following the formation of gate insulator layer 22, a high-k gate insulator layer 24 is blanket-deposited overlying gate insulator layer 22. Preferably, high-k gate insulator layer 24 is formed of a deposited high dielectric constant (high-k) insulating material such as an oxide of hafnium including hafnium silicon oxides (Hf-$Si_xO_y$), hafnium dioxide ($HfO_2$), and hafnium oxynitrides ($HfO_xN_y$), or hafnium silicon oxynitrides ($HfSi_xO_yN_z$), where x, y, and z are greater than zero, zinc dioxide ($ZnO_2$), or the like, and preferably is formed of $HfO_2$. High-k gate insulator layer 24 may be deposited, for example, by CVD, LPCVD, PECVD, physical vapor deposition (PVD), or atomic layer deposition (ALD). The material chosen for high-k gate insulator layer 24 has a dielectric constant of greater than about 7.0, and preferably is at least about 12.0. High-k gate insulator layer 24 has a thickness of from about 1.4 nm to about 2.4 nm, and preferably is about 1.7 nm thick.

A metal-comprising gate electrode layer 48 is then deposited overlying high-k gate insulator 24. The metal-comprising gate electrode layer 48 may be formed of lanthanum (La) or lanthanum alloys, aluminum (Al) or aluminum alloys, magnesium (Mg) or magnesium alloys, titanium (Ti) based materials such as titanium nitride (TiN) or titanium aluminum nitride (TiAlN), tantalum (Ta) based materials such as tantalum nitride (TaN), tantalum aluminum nitride (TaAlN), or tantalum carbide ($Ta_2C$), tungsten nitride (WN), or the like, and is preferably TiN. Deposition of metal-comprising gate electrode layer 48 may be performed using a PVD or CVD process. Metal-comprising gate electrode layer 48 preferably has a thickness of from about 2.5 nm to about 7 nm, and is preferably about 3.5 nm thick.

The method continues with the blanket deposition of a doped silicon capping layer 52 overlying metal-comprising gate electrode layer 48. Because it is undesirable to allow the formation of a native oxide on an outer surface 50 of metal-comprising gate electrode layer 48, the substrate is preferably kept in a substantially oxygen-free environment (such as, for example, under a vacuum if used during the deposition of metal-comprising gate electrode layer 48) until after the deposition of doped silicon capping layer 52. During the deposition process, doped silicon capping layer 52 is in-situ doped using P-type or N-type elements. Dopants of a P-type that may be used include boron (B), and those of an N-type include phosphorous (P), arsenic (As), or antimony (Sb). In one embodiment, doped silicon capping layer 52 has a thickness in a range of from about 5 nm to about 10 nm, and is preferably about 8 nm thick. In another embodiment, the dopant concentration of layer 52 is from about $1.0 \times 10^{19}$ to about $1.0 \times 102^{20}$ atoms per cubic centimeter (at/cm³).

Still referring to FIG. 1, silicon-comprising gate electrode layer 60 is formed overlying doped silicon capping layer 52. The material used for silicon-comprising gate electrode layer 60 may comprise amorphous or polycrystalline silicon, and preferably comprises polycrystalline silicon. Silicon-comprising gate electrode layer 60 is preferably deposited as an undoped polycrystalline silicon layer and is subsequently impurity doped by ion implantation. Impurity dopants that may be used include B, As, P, and Sb. Silicon-comprising gate electrode layer 60 may be deposited by, for example, LPCVD by the hydrogen reduction of silane ($SiH_4$).

Following the deposition of silicon-comprising gate electrode layer 60, additional layers may be formed depending upon the overall process used. These layers include a hard mask layer 64 that is blanket-deposited overlying silicon-comprising gate electrode layer 60. Hard mask layer 64 has a composition and thickness suitable for use as a hard mask to etch each of the layers overlying substrate 14. Exemplary materials that may be used for hard mask layer 64 include TiN and preferably include $Si_3N_4$, or $SiO_x$.

Figure 2:
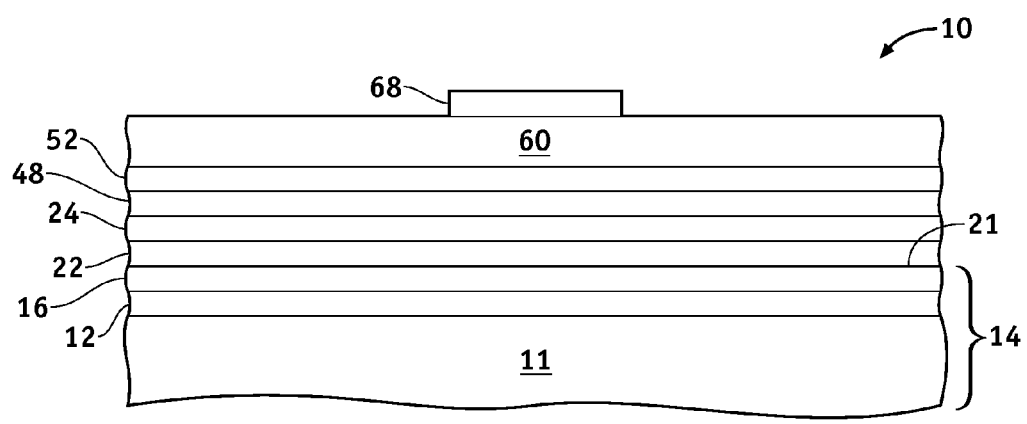
Figure 3:
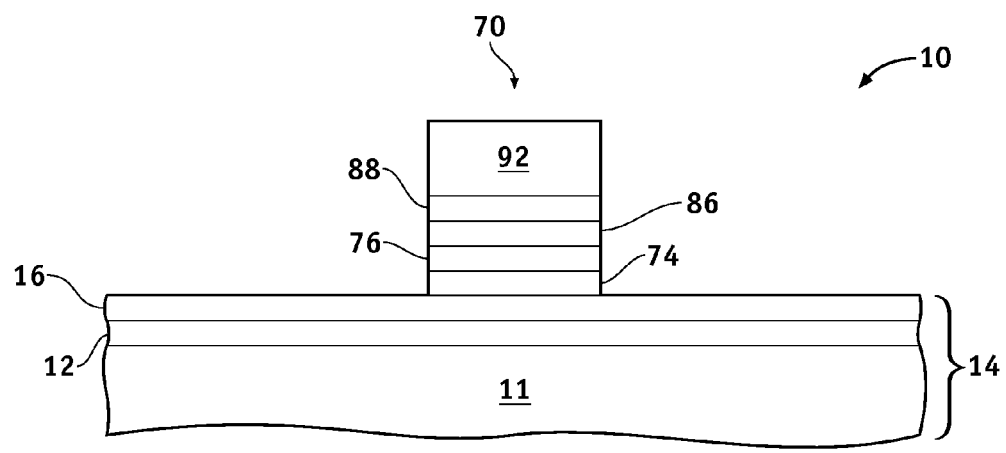

Hard mask layer 64 then is patterned using a suitable photolithography and anisotropic etch process such as a reactive ion etch (RIE) process sequence to form a hard mask 68, as illustrated in FIG. 2. Hard mask 68 is subsequently used as an etch mask for etching layers 22, 24, 48, 52, and 60 and is then removed along with any remaining photoresist. Following such etching and removal, the result is a gate stack 70 comprising a gate insulator 74, a high-k gate insulator 76, a metal-comprising gate electrode 86, a doped silicon cap 88, and a silicon gate electrode 92, as illustrated in FIG. 3.

Figure 4:
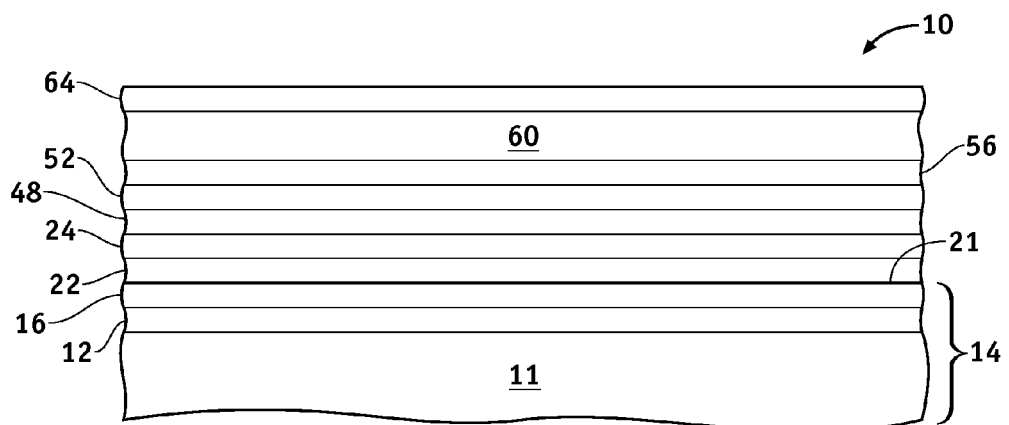

In accordance with another embodiment, a silicide-forming metal capping layer 56 is deposited overlying doped silicon capping layer 52 before the formation of silicon-comprising gate electrode layer 60, as illustrated in FIG. 4. Silicide-forming metal capping layer 56 may comprise any metal capable of reacting with silicon to form a metal silicide such as, for example, nickel (Ni), platinum (Pt), cobalt (Co), or Ti, or any combination of these. In one embodiment, silicide-forming metal capping layer 56 comprises Ni and includes about 5-15 atomic % of Pt, and preferably contains about 5-10 atomic % Pt. A NiPt film of such a composition can be accommodated in a PVD system by using a target having the desired composition. Silicide-forming metal capping layer 56 is deposited to a thickness of from about 4 nm to about 12 nm, and is preferably between about 5 nm and 10 nm thick. Following the formation of silicide-forming metal capping layer 56, silicon-comprising gate electrode layer 60 and hard mask layer 64 may be sequentially deposited as described above.

Figure 5:
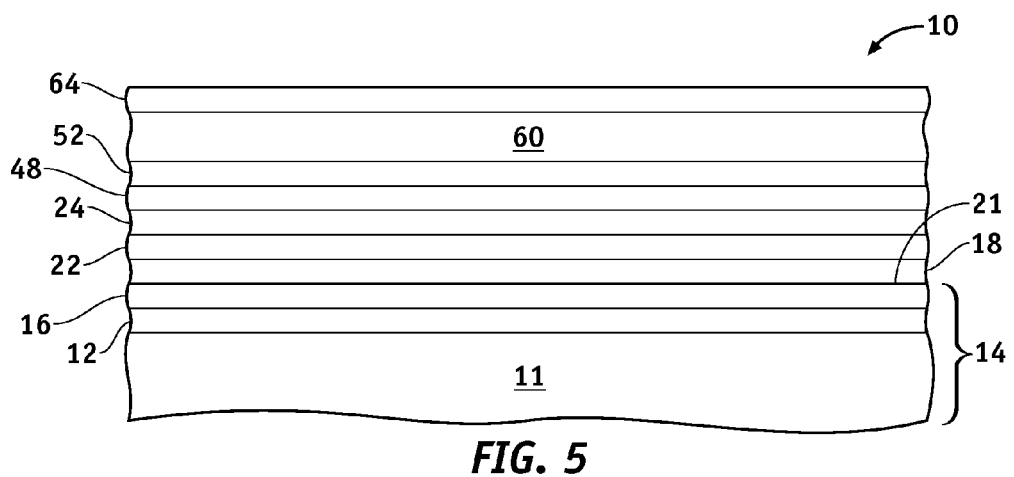

In accordance with a further embodiment, especially efficacious when device 10 is fabricated as a PFET device, a channel layer 18 comprising a monocrystalline material is selectively epitaxially grown on a portion of silicon surface 21 before the formation of gate insulator layer 22 resulting in the structure illustrated in FIG. 5. For a PFET device, channel layer 18 may comprise any compressively-stressed semiconductor material suitable as a PFET channel such as, for example, silicon germanium (SiGe), germanium (Ge), or indium phosphide (InP), and preferably comprises SiGe. If device 10 is to be an NFET device, a tensile-stressed monocrystalline semiconductor material may be selectively epitaxially grown alternatively. A compressively-stressed SiGe layer can be epitaxially grown, for example, by the reduction of silane ($SiH_4$) or dichlorosilane ($SiH_2Cl_2$) with Ge added to these reactants. Growth selectivity to prevent SiGe film formation on non-silicon surfaces (not illustrated) may be controlled by introducing hydrochloric acid (HCl) into the epitaxial process as necessary. The concentration of Ge incorporated into channel layer 18 is in a range of from about 20% to about 35%, and is preferably about 23% Ge. The method then continues as illustrated in and described with respect to FIGS. 1-3 or FIGS. 1-4.

Figure 6:
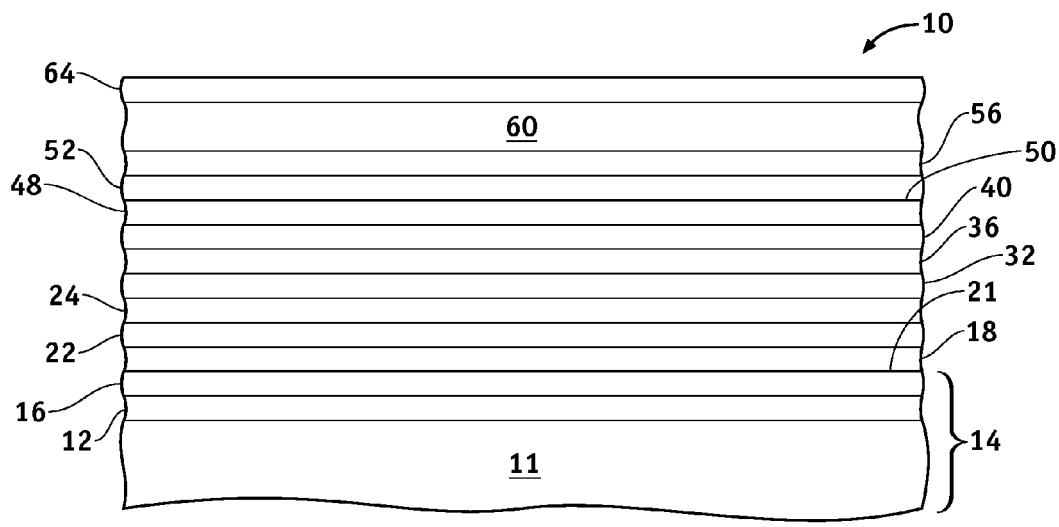

In accordance with yet another embodiment, following the formation of gate insulator layer 22 and high-k gate insulator 24 illustrated in FIG. 1, either with or without channel layer 18 illustrated in FIG. 5, and described previously, additional metal-comprising layers are deposited overlying high-k gate insulator layer 24, as illustrated in FIG. 6. These metal-comprising layers can be deposited using any suitable metal deposition process including, for example, plasma vapor deposition (PVD) or ALD, and may be formed of La or lanthanum alloys, Al or aluminum alloys, Mg or magnesium alloys, titanium-based materials such as TiN or TiAlN, tantalum-based materials such as TaN, TaAlN, or $Ta_2C$, or WN, or the like, or combinations thereof. Such metal-comprising layers may be especially useful in PFET devices to adjust performance parameters such as to set $V_t$ for device 10 at or near the conduction band edge. For example, referring to FIG. 6, in one exemplary embodiment, a metal-comprising layer 32 preferably comprising TiN is deposited overlying high-k gate insulator layer 24. Metal-comprising layer 32 may be deposited using either PVD or ALD and has a thickness of about from 1.5 nm to about 2.5 nm, and is preferably about 2.0 nm thick. The method then continues as described and illustrated above.

In accordance with a further embodiment, additional metal-comprising layers 36 and/or 40 may be sequentially deposited overlying metal-comprising layer 32 as illustrated in FIG. 6. Metal-comprising layers 36 and 40 also may comprise any one or a combination of the metals disclosed above for use in forming metal-comprising layer 32, and preferably comprise Al and TiN, respectively. In one embodiment, metal-comprising layer 36 has a thickness in a range of about from 0.1 nm to about 0.8 nm and is preferably about 0.8 nm thick. Metal-comprising layer 40 has a thickness in a range of about from 1.0 nm to about 2.5 nm and is preferably about 1.5 nm thick. Metal-comprising layers 32, 36, and/or 40 may be used singly or in combination to set the $V_t$ for a PFET device to the desired level.

Figure 7:
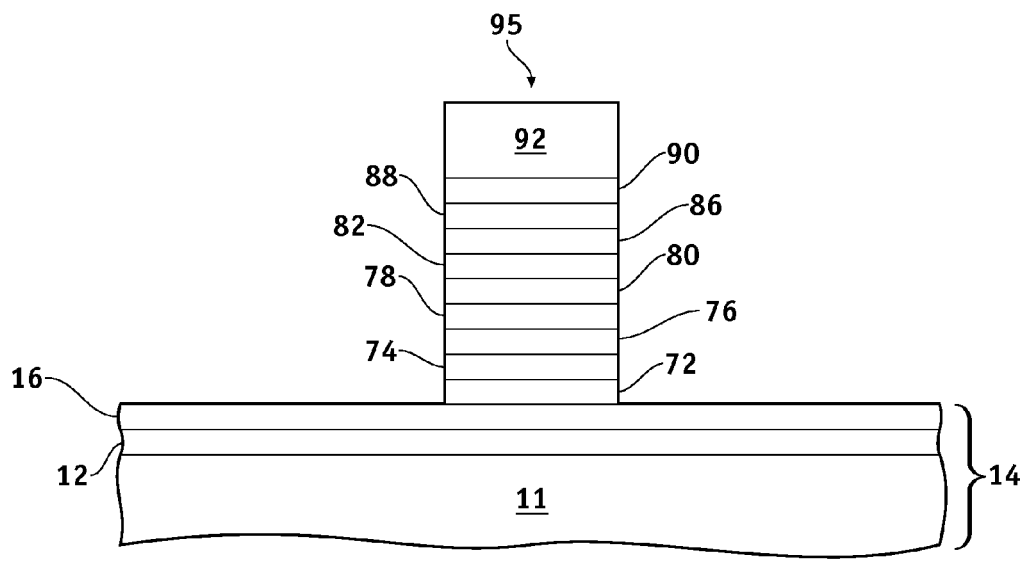

Following the formation of metal comprising layers 32, 36, and/or 40, the method continues with the formation of metal-comprising gate electrode layer 48, silicon capping layer 52, silicide-forming metal capping layer 56 (if used), silicon-comprising gate electrode layer 60, and hard mask layer 64, as illustrated and described previously. Hard mask layer 64 may be patterned into a hard mask subsequently used to etch each of these layers along with channel layer 18, gate insulator layer 22 and high-k gate insulator layer 24. Following these etches and the removal of hard mask layer 64, a gate stack 95 is formed that includes a PFET channel 72, gate insulator 74 and high-k gate insulator 76, optional metal-comprising layers 78, 80, and 82, metal-comprising gate electrode 86, doped silicon cap 88, an optional silicide-forming metal cap 90, and silicon gate electrode 92, as illustrated in FIG. 7.

Figure 8:
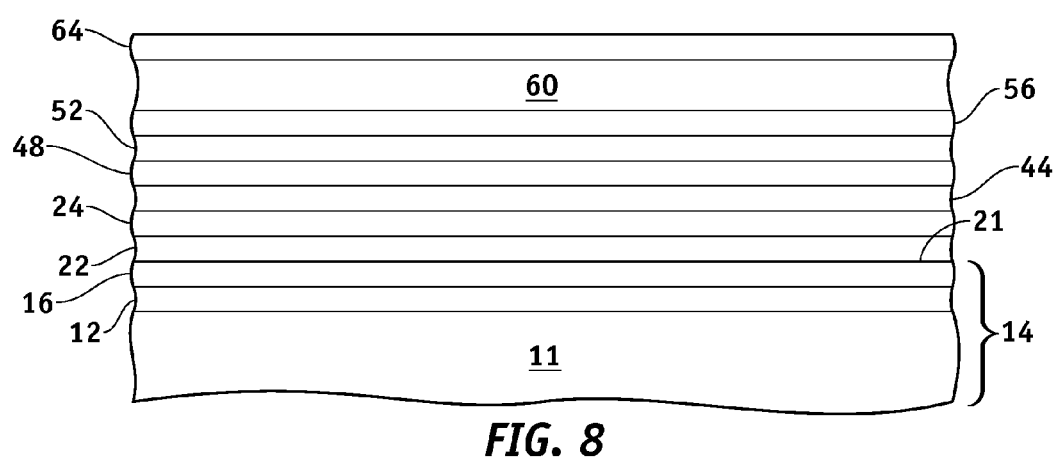

In accordance with still another embodiment, when device 10 is fabricated as an NFET device, the method steps described and illustrated above are executed except that a metal oxide gate capping layer 44 is deposited following the formation of high-k gate insulator 24, as illustrated in FIG. 8. Metal oxide gate capping layer 44 may be used to set the $V_t$ for an NFET device at or near the conduction band edge, and may comprise any one or a combination of metal oxides and/or metal oxynitrides including La, lanthanum oxides ($LaO_x$), and lanthanum oxynitrides ($LaO_xN_y$), hafnium oxides ($HfO_x$) and hafnium oxynitrides ($HfO_xN_y$), zirconium oxides ($ZrO_x$) and zirconium oxynitrides ($ZrO_xN_y$), magnesium oxides ($MgO_x$) and magnesium oxynitrides ($MgO_xN_y$), aluminum oxides ($AlO_x$) and aluminum oxynitrides ($AlO_xN_y$), titanium oxides ($TiO_x$) and titanium oxynitrides ($TiO_xN_y$), tantalum oxides ($TaO_x$) and tantalum oxynitrides ($TaO_xN_y$), and yttrium oxides ($YO_x$) and yttrium oxynitrides ($YO_xN_y$), where x and y are numbers greater than zero, and preferably is La. Metal oxide gate capping layer 44 may be deposited using any suitable deposition technique such as, for example, a PVD process such as evaporation or sputtering, CVD, PECVD, LPCVD, ALD, and preferably is formed by ALD. Layer 44 may also be formed as a self-assembling or self-assembled monolayer (SAM) using a chemical compound suitable for such deposition. Such a compound typically comprises a molecular structure suitably functionalized for adhesive attraction or bonding to molecular sites of a substrate surface, but lacking a propensity to form films that exceed monolayer thicknesses. SAM compounds may be deposited via casting from a suitable solvent using, for example, a spin coating or dipping process. The thickness of metal oxide gate capping layer 44 is in a range of from about 0.1 nm to about 0.8 nm and is preferably about 0.4 nm thick.

Figure 9:
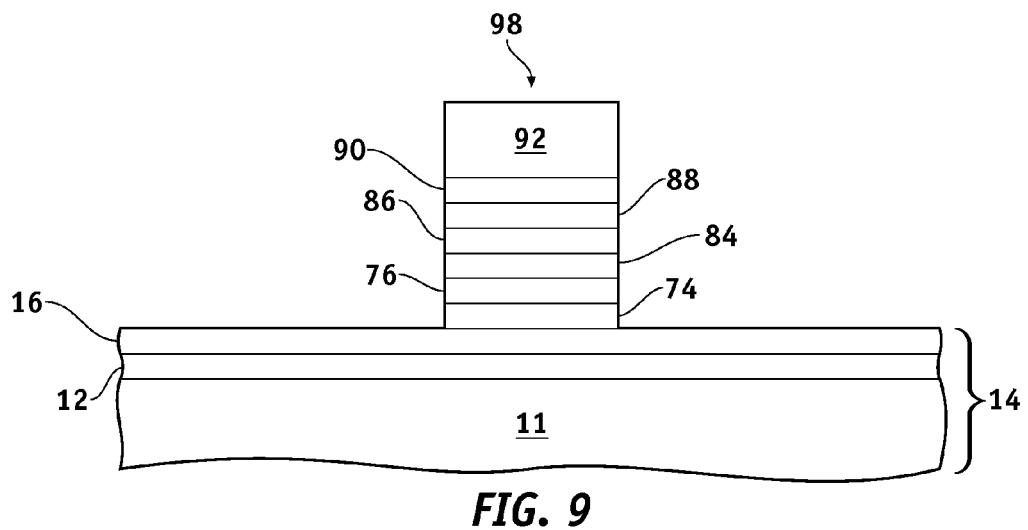

Following the formation of metal oxide gate capping layer 44, the method continues in accordance with any of the embodiments described and illustrated above. Hard mask layer 64 may be patterned and used as an etch mask to remove portions of these layers including gate insulator layer 22, high-k gate insulator 24, and metal oxide gate capping layer 44. Following these etches and the removal of hard mask layer 64, a gate stack 98 is formed that includes gate insulator 74 and high-k gate insulator 76, metal oxide gate cap 84, metal-comprising gate electrode 86, doped silicon cap 88, an optional silicide-forming metal cap 90, and silicon gate electrode 92, as illustrated in FIG. 9.

Subsequent to the formation of either of gate stacks 70 (FIG. 3), 95 (FIG. 7), or 98, device 10 may undergo additional processes that may involve exposure to elevated temperatures such as, for example, those commonly used to activate source and drain dopants or to reactively transform silicon gate electrode 92, in combination with a subsequently deposited metal layer, into a metal silicide gate electrode contact. In cases wherein doped silicon cap 88 is used in a gate stack without silicide-forming metal cap 90, one of two possible results is likely to occur. As a first possible result, doped silicon cap 88 may be transformed into a doped metal silicide provided silicon gate electrode 92 is itself completely transformed into a silicide. As a second possible result, if silicon gate electrode 92 is not completely transformed into a silicide such as, for example, if silicon gate electrode 92 is excessively thick for such a complete transformation, doped silicon cap 88 may remain as an unreacted, conductive, transitional doped silicon layer between metal-comprising gate electrode 86 and silicon gate electrode 92. A third result is likely to occur in the case wherein silicide-forming metal cap 90 is included in the gate stack. In this case, subsequent heat treatments involving sufficient exposure to time and temperature, (such as, for example about 400° C. or higher for greater than about 5 seconds) will cause silicide-forming metal cap 90 to react with the adjacent doped silicon cap 88 to form a layer comprising a doped silicide of the silicide-forming metal. A portion of silicide-forming metal may also react with polycrystalline silicon from the adjacent silicon gate electrode 92 to form a metal silicide. If doped silicon from cap 88 is present in stoichiometric excess over silicide-forming metal, a portion of doped silicon may remain unreacted or may be transformed into a doped metal silicide region during the process of transforming silicon gate electrode 92 into a metal silicide gate contact. Layers comprising either doped silicon or preferably doped metal silicides interposed between metal-comprising gate electrode 86 and silicon gate electrode 92 have been experimentally found to lower the AC impedance of a gate stack, and enhance the overall AC performance of the device thereby.

FIGS. 10-22 illustrate schematically, in cross-section, in accordance with exemplary embodiments of the invention, a portion of a semiconductor device 100 and methods for forming such a semiconductor device having P-channel MOS (PMOS) and N-channel MOS (NMOS) transistors with doped silicon capping layers. While the fabrication of portions of one NMOS and one PMOS transistor is illustrated, it will be appreciated that the method depicted in FIGS. 10-22 can be used to fabricate any number of such transistors. As with the previous method, various steps in the manufacture of MOS components are well known and so, in the interest of brevity, many conventional steps will only be mentioned briefly or will be omitted.

Figure 10:
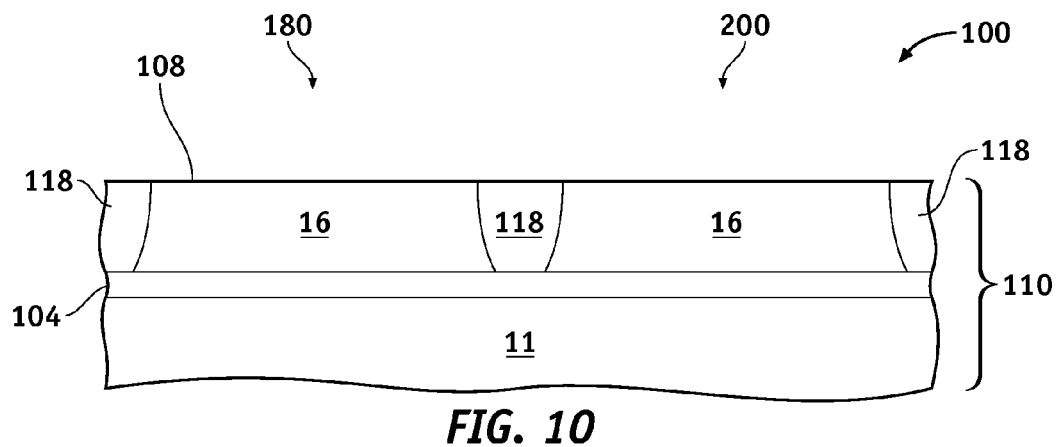
FIGS. 10-22, illustrate schematically, in cross-section, a portion of a semiconductor device and methods for fabricating such a semiconductor device having doped silicon-comprising capping layers in accordance with another exemplary embodiment.

Referring to FIG. 10, in accordance with an exemplary embodiment, the method begins by providing a semiconductor substrate 110. Semiconductor substrate 110 is similar to semiconductor substrate 14 described above but further comprises isolation regions 118 that extend through thin silicon layer 16 to insulating layer 104. Isolation regions 118 are preferably formed by well known shallow trench isolation (STI) techniques in which trenches are etched into thin silicon layer 16, the trenches are filled with a dielectric material such as deposited silicon oxide, and the excess silicon oxide is removed by chemical mechanical planarization (CMP). Isolation regions 118 are used to electrically isolate an NFET region 180 and a PFET region 200 upon which gate stacks for NFET and PFET transistors, respectively, are subsequently formed. At least a surface region 108 of silicon substrate 110 is impurity doped, for example by forming an N-type well region in PFET region 200 and a P-type well region in NFET region 180 for the fabrication of PFET and NFET transistors, respectively.

Figure 11:
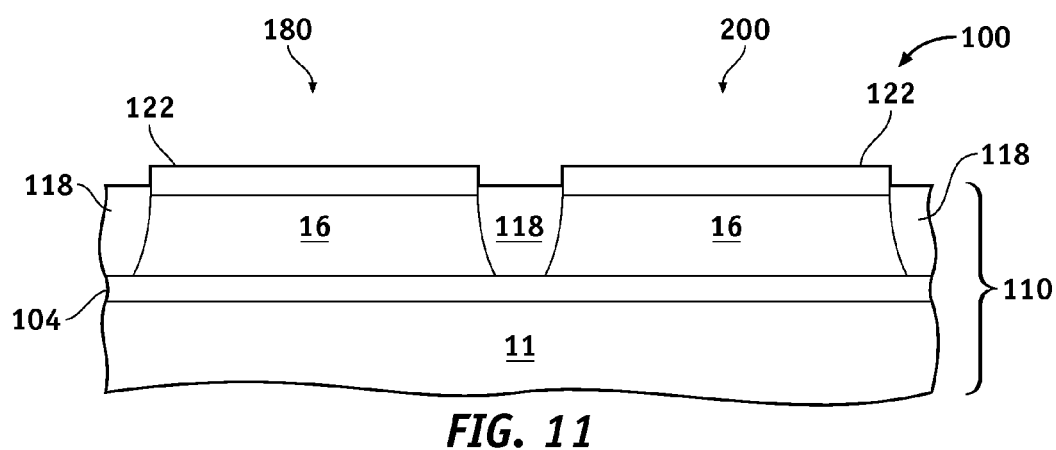

Next, a hard mask layer 122 is formed overlying NFET and PFET regions 180 and 200, as illustrated in FIG. 11. Hard mask layer 122 may comprise thermally grown $SiO_2$ or, alternatively, may comprise a deposited $SiO_x$, $Si_3N_4$, or SiON, or another material suitable for providing masking protection during a subsequent epitaxial growth process. When a deposition process is used, hard mask layer 122 may be blanket-deposited, for example, by CVD, LPCVD, or PECVD. Preferably hard mask layer 122 is thermally grown $SiO_2$ formed at the surface of thin silicon layer 16, as illustrated, and has a thickness in a range of from about 7 nm to about 15 nm, and is preferably about 8 nm thick.

Figure 12:
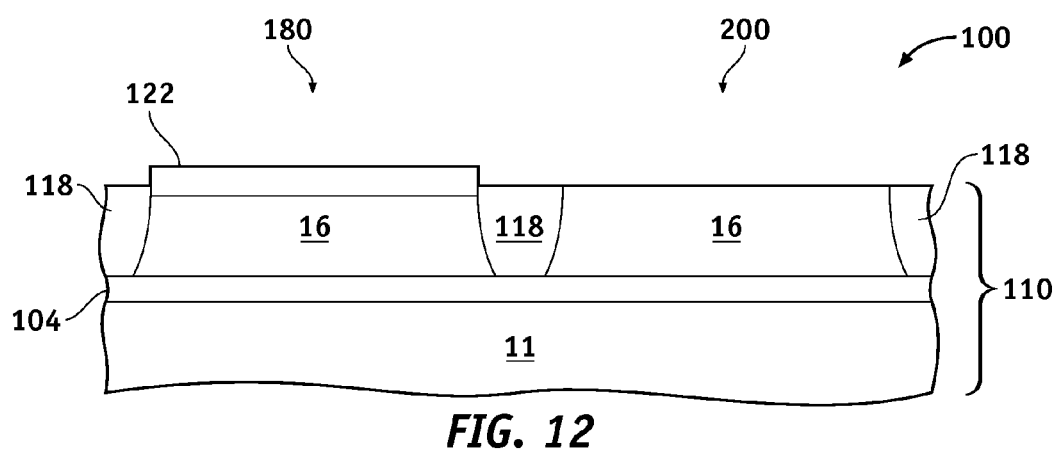
Figure 13:
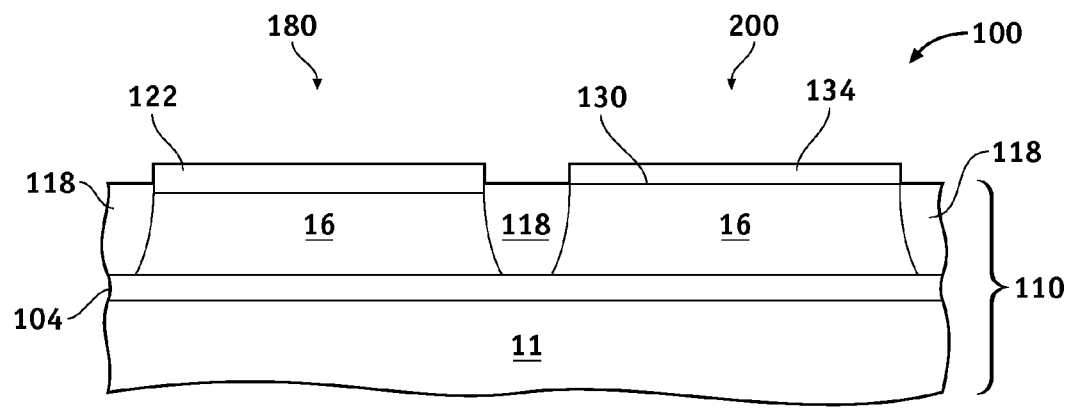

Hard mask layer 122 then is removed from PFET region 200 using a suitable lithography and RIE process sequence, as illustrated in FIG. 12. The RIE process chemistry used depends on the material selected for hard mask layer 122 and may be based on, for example, $CHF_3$, $CF_4$ or $SF_6$ for both silicon oxide/dioxide, or silicon nitride. A PFET channel layer 134 comprising a monocrystalline semiconductor material then is epitaxially grown on a silicon surface 130 of thin silicon layer 16 in PFET region 200, as illustrated in FIG. 13. The epitaxial process is performed selectively to silicon surfaces so that growth on non-silicon surfaces such as hard mask layer 122 does not occur. PFET channel layer 134 may comprise any of the compressively-stressed semiconductor materials and composition ranges described previously for channel layer 18, and may be formed using the same epitaxial process. Preferably, PFET channel layer 134 comprises SiGe having a composition of about 23% Ge. Hard mask layer 122 then is removed using an RIE process selective to PFET channel layer 134.

Figure 14:
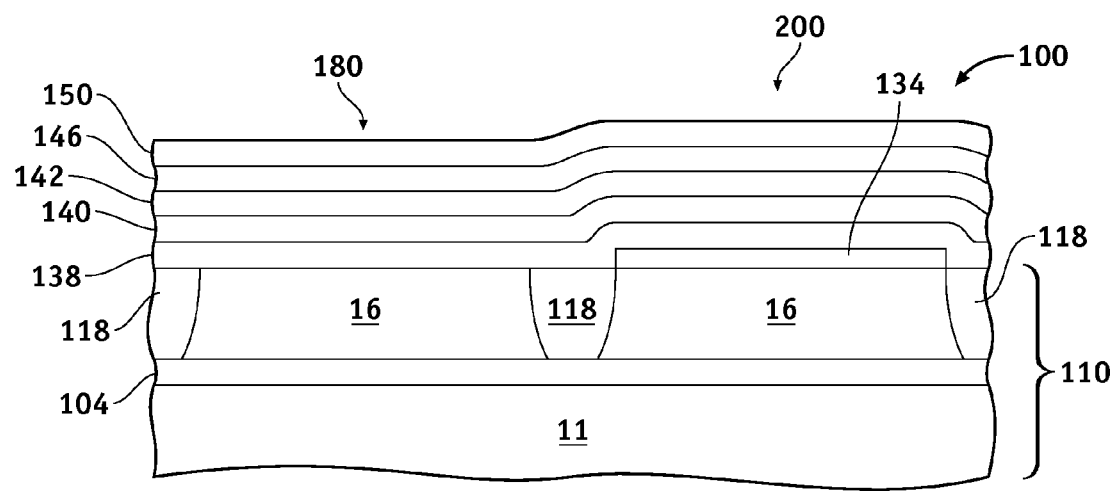

Next, as illustrated in FIG. 14, a gate insulator layer 138 is blanket-deposited overlying semiconductor device 100 including thin silicon layer 16 in NFET region 180 and PFET channel layer 134 in PFET region 200. Gate insulator layer 138 comprises a deposited insulating material such as a $SiO_x$, $Si_3N_4$, or SiON, and preferably is SiON. Deposition may be performed, for example, by a CVD, LPCVD, or PECVD process. Gate insulator layer 138 has a thickness of about 0.8 to about 1.2 nm, and preferably is about 0.8 nm thick.

Still referring to FIG. 14, following the formation of gate insulator layer 138, a high-k gate insulator layer 140 is blanket-deposited overlying NFET and PFET regions 180 and 200. Preferably, high-k gate insulator layer 140 is formed of a deposited high-k insulating material such as an oxide of hafnium including $HfSi_xO_y$, $HfO_2$, $HfO_xN_y$, and $HfSi_xO_yN_z$, where x, y and z are each greater than zero, $ZnO_2$, or the like, and preferably is $HfO_2$. High-k gate insulator layer 140 may be deposited, for example, by CVD, LPCVD, PECVD, PVD, or ALD. The material chosen for high-k gate insulator layer 140 has a dielectric constant of greater than about 7.0, and preferably is at least about 12.0. High-k gate insulator layer 140 has a thickness of from about 1 nm to about 10 nm, and preferably is about 1.7 nm thick.

Next, in various exemplary embodiments, additional metal-comprising layers are deposited overlying high-k gate insulator layer 140, and used to establish the $V_t$ of the PFET device to be fabricated in PFET region 200. Such layers may subsequently be removed from NFET region 180 as will be described in further detail below. Referring to FIG. 14, in one embodiment, a metal-comprising layer 142 is blanket-deposited overlying high-k gate insulator layer 140 in both NFET and PFET regions 180 and 200. Metal-comprising layer 142 may be deposited using any suitable metal deposition process including PVD or ALD, and has a thickness in a range of from about 1.5 nm to about 2.5 nm, and is preferably about 2.0 nm thick. Metal-comprising layer 142 may be formed of La or lanthanum alloys, Al or aluminum alloys, Mg or magnesium alloys, titanium-based materials such as TiN or TiAlN, tantalum-based materials such as TaN, TaAlN, or $Ta_2C$, or WN, or the like, or combinations thereof, and is preferably formed of TiN.

In accordance with further embodiments, metal-comprising layers 146 and/or 150 are sequentially blanket-deposited overlying metal-comprising layer 142 in both NFET and PFET regions 180 and 200. Metal-comprising layers 146 and 150 may comprise and be deposited by any of the materials and processes described above with reference to metal-comprising layer 142. Metal-comprising layer 146 is preferably Al, and has a thickness in a range of from about 0.1 nm to about 0.8 nm, and is preferably about 0.8 nm thick. Metal-comprising layer 150 is preferably TiN, has a thickness in a range of from about 1 nm to about 2.5 nm, and is preferably about 1.5 nm thick.

Figure 15:
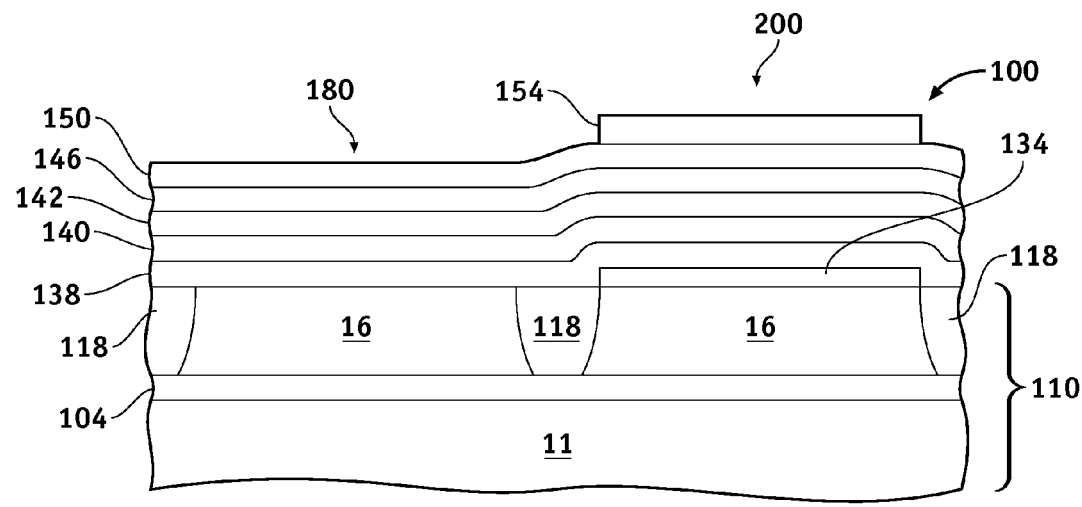
Figure 16:
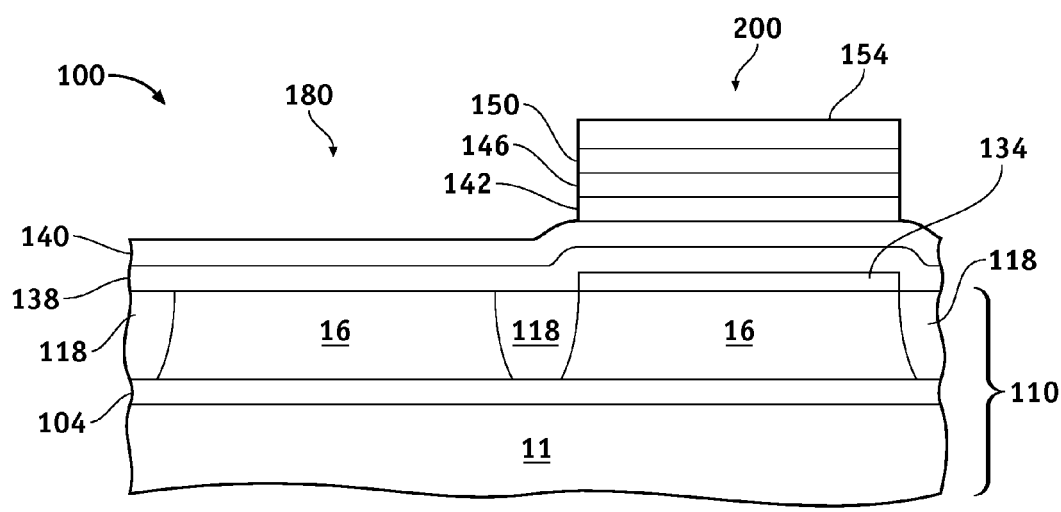

Any of metal-comprising layers 142, 146, and 150 that are used are then each removed from NFET region 180 using a suitable patterning process. This process preferably includes the formation of a hard mask 154 using a suitable deposition, lithography, and dry etch process sequence previously described for hard masking layers, as illustrated in FIG. 15. Next, hard mask 154 is used as an etch mask to remove metal-comprising layers 142, 146, and 150 from NFET region 180, as illustrated in FIG. 16. The etch process is performed selectively so as not to erode high-k gate insulator layer 140 in NFET region 180. The etch chemistry used will depend, in part, on the material compositions to be etched in metal-comprising layers 142, 146, and 150, and may be based upon, for example, a $Cl_2$/HBr chemistry for TiN, a $Cl_2$/$CF_4$ chemistry for TaN, or a $SF_6$/$CH_2F_2$ chemistry for WN. Following this etch, hard mask layer 154 may be removed using a suitable wet or dry etch process that does not erode metal-comprising layers 142, 146, and/or 150 (if used) from PFET region 200, or high-k gate insulator layer 140 from NFET region 180.

Figure 17:
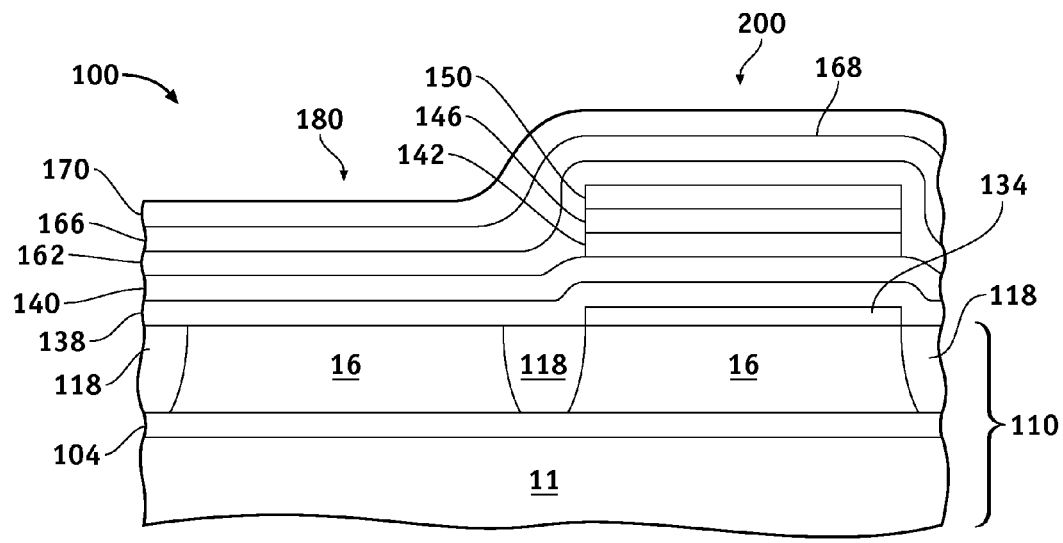

Following the removal of hard mask layer 154, the method continues with the blanket deposition of a metal oxide gate capping layer 162 overlying NFET and PFET regions 180 and 200, as illustrated in FIG. 17. As disclosed above with reference to metal oxide gate capping layer 44, metal oxide gate capping layer 162 may be used to set $V_t$ for the NFET device to be formed in NFET region 180. Metal oxide gate capping layer 162 may comprise any one or a combination of metal oxides and/or metal oxynitrides including La, $LaO_x$, and $LaO_xN_y$, $HfO_x$ and $HfO_xN_y$, $ZrO_x$ and $ZrO_xN_y$, $(MgO_x)$ and $MgO_xN_y$, $AlO_x$ and $AlO_xN_y$, $TiO_x$ and $TiO_xN_y$, $TaO_x$ and $TaO_xN_y$, $YO_x$ and $YO_xN_y$, where x and y are numbers greater than zero, and preferably is La. Metal oxide gate capping layer 162 may be deposited using any of the suitable deposition techniques and having a thickness range as previously described with reference to metal oxide gate capping layer 44.

Next, a metal-comprising gate layer 166 is formed overlying metal gate capping layer 162. The metal-comprising gate layer 166 may be formed of La or lanthanum alloys, Al or aluminum alloys, Mg or magnesium alloys, titanium-based materials such as TiN or TiAlN, tantalum-based materials such as TaN, TaAlN, or $Ta_2C$, WN, or the like, and is preferably TiN. Deposition of metal-comprising gate layer 166 may be performed using a PVD or CVD process. Metal-comprising gate layer 166 preferably has a thickness of from about 2.5 nm to about 7 nm, and is preferably about 3.5 nm thick.

Following the deposition of metal-comprising gate layer 166, semiconductor device 100 is maintained under vacuum (if used for the deposition of layer 166) or in another type of substantially oxygen-free environment to avoid the formation of a native oxide on a surface 168 of metal-comprising gate layer 166. Next, a doped silicon capping layer 170 comprising doped silicon is blanket-deposited overlying metal-comprising gate layer 166 in NFET and PFET regions 180 and 200 using, for example, an LPCVD process. Doped silicon capping layer 170 comprises silicon admixed with an impurity dopant incorporated into the film in situ during the deposition process. Such dopant elements may include those of a P-type such as boron (B), or those of an N-type such as phosphorous (P), arsenic (As), or antimony (Sb). In one embodiment, doped silicon capping layer 170 has a thickness in a range of from about 5 nm to about 10 nm, and is preferably about 8 nm thick. In another embodiment, doped silicon capping layer 170 has a dopant concentration of from about from $1.0 \times 10^{19}$ to about $1.0 \times 10^{20}$ at/cm$^3$.

Figure 18:
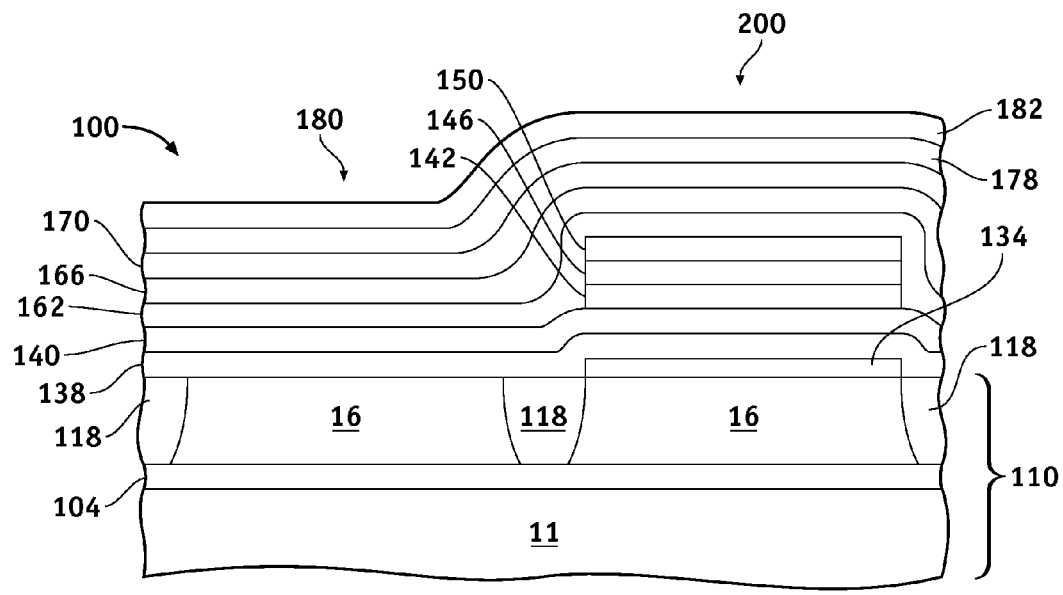

A silicon-comprising gate electrode layer 178 next is formed overlying doped silicon capping layer 170, as illustrated in FIG. 18. Silicon-comprising gate electrode layer 178 may comprise amorphous or preferably, polycrystalline silicon, and may be deposited and implant-doped using the process and dopant elements previously described for silicon-comprising gate electrode layer 60.

Figure 19:
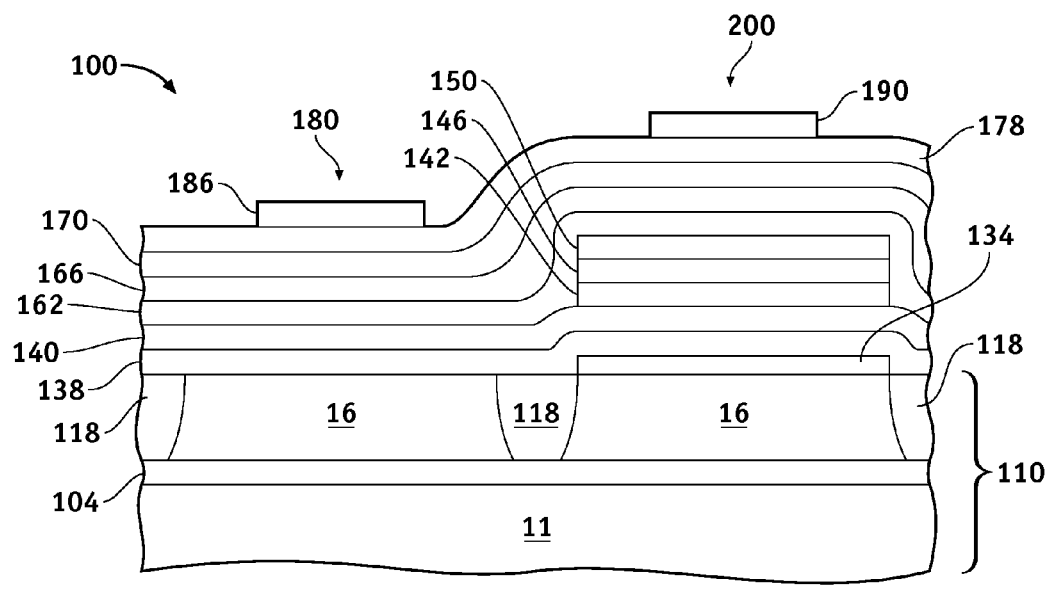
Figure 20:
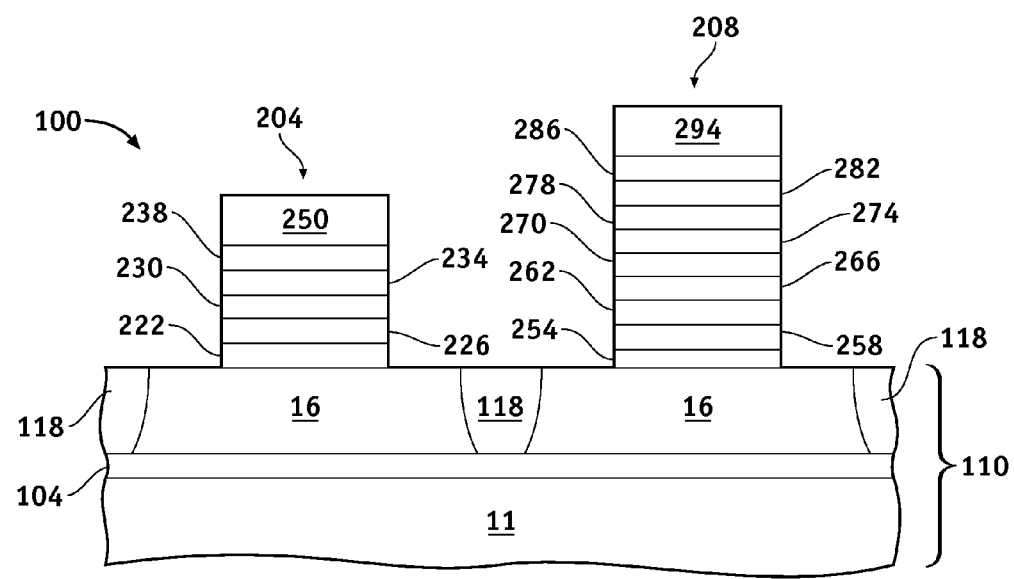

Following the deposition of silicon-comprising gate electrode layer 178, additional layers may be formed depending upon the intended application for device 100 and the overall process used. These layers include a blanket-deposited hard mask layer (not shown) overlying silicon-comprising gate electrode layer 178 that is patterned using a suitable lithography and dry etch sequence to form hard masks (not shown) overlying NFET and PFET regions 180 and 200, respectively, as illustrated in FIG. 19. Hard masks (not shown) are each used as etch masks to remove portions of the layers overlying regions 180 and 200 to form gate stacks 204 and 208, respectively, as illustrated in FIG. 20. When such etching and removal including the removal of hard masks (not shown) is complete, gate stack 204 includes an NFET gate insulator 222, an NFET high-k gate insulator 226, an NFET metal oxide gate cap 230, an NFET metal-comprising gate electrode 234, an NFET doped silicon cap 238, and an NFET silicon gate electrode 250. Gate stack 208 includes a PFET channel 254, a PFET gate insulator 258, a PFET high-k gate insulator 262, optional PFET metal comprising layers 266, 270, and 274, a PFET metal oxide gate cap 278, a PFET metal comprising gate electrode 282, a PFET doped silicon cap 286, and a PFET silicon gate electrode 294.

Figure 21:
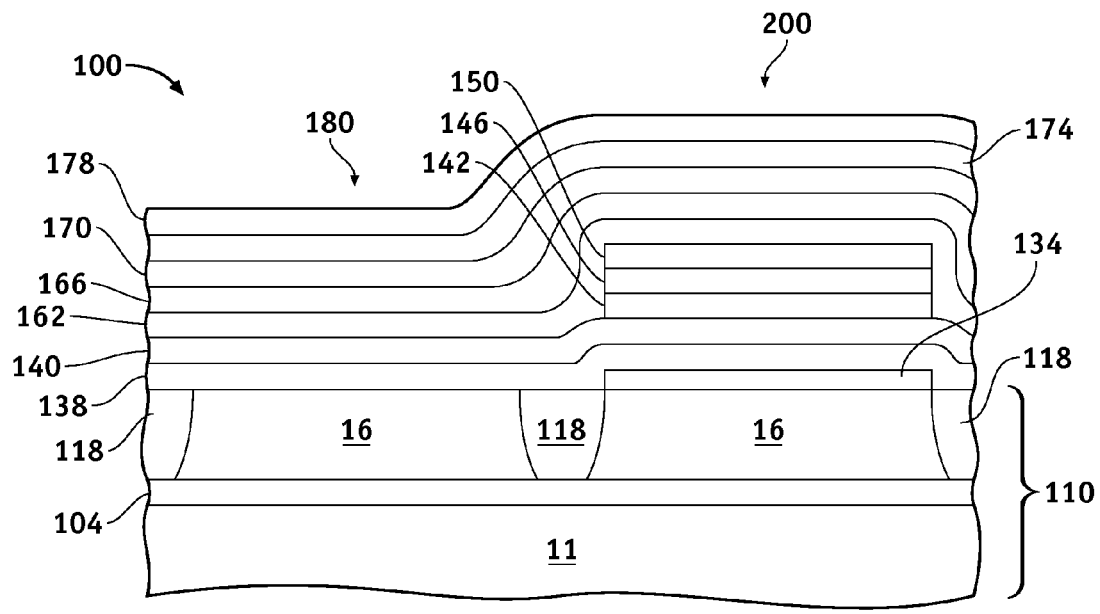
Figure 22:
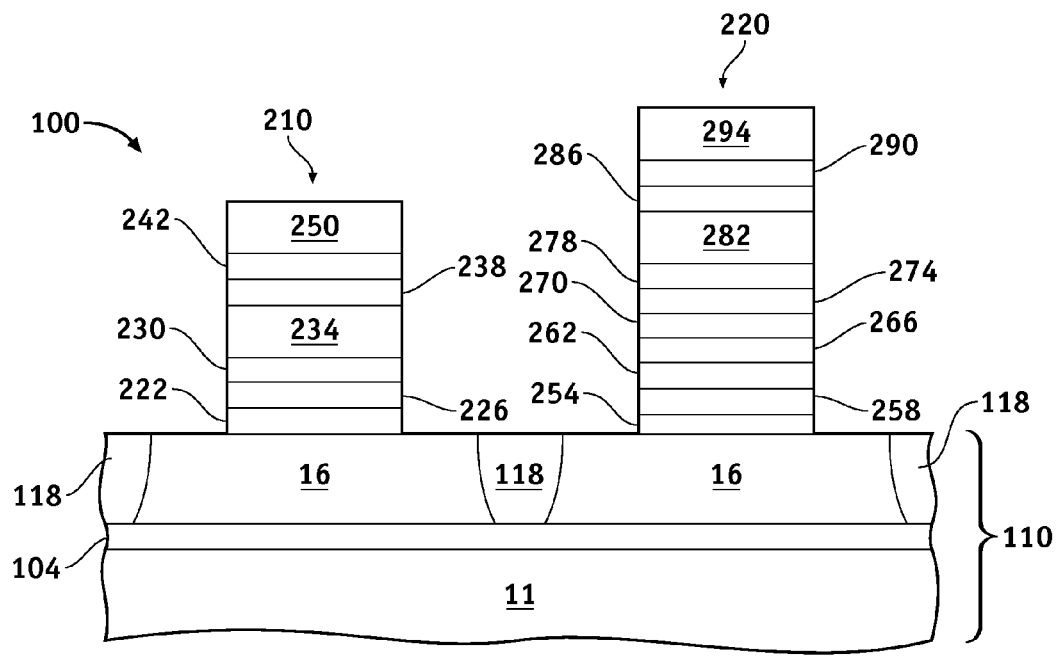

In another embodiment, a silicide-forming metal capping layer 174 is deposited overlying doped silicon capping layer 170 prior to the formation of silicon-comprising gate electrode layer 178 in both regions 180 and 200, as illustrated in FIG. 21. Silicide-forming metal capping layer 174 may comprise any of the metals or any combination of the metals described above with reference to silicide-forming metal capping layer 56. In a further embodiment, silicide-forming metal capping layer 174 comprises Ni and includes about 5-15 atomic % of Pt, and preferably contains about 5-10 atomic % Pt. Silicide-forming metal capping layer 174 is deposited to a thickness of from about 4 nm to about 12 nm, and is preferably between about 5 nm and about 10 nm thick. Following the formation of silicide forming metal capping layer 174, process steps previously described and illustrated in FIGS. 18 and 19 are executed including the formation of silicon-comprising gate electrode layer 178, hard masking layer (not shown), and hard masks (not shown). These hard masks then are used as etch masks and removed for the formation of gate stacks 210 and 220 overlying regions 180 and 200, respectively, as illustrated in FIG. 22.

Following this etch and the removal of hard masks 186 and 190, gate stack 210 includes NFET gate insulator 222, NFET high-k gate insulator 226, NFET metal oxide gate cap 230, NFET metal-comprising gate electrode 234, NFET doped silicon cap 238, an NFET silicide-forming metal cap 242, and NFET silicon gate electrode 250. Gate stack 220 includes PFET channel 254, PFET gate insulator 258, PFET high-k gate insulator 262, optional PFET metal-comprising layers 266, 270, and 274, PFET metal oxide gate cap 278, PFET metal-comprising gate electrode 282, PFET doped silicon cap 286, a PFET silicide-forming metal cap 290, and PFET silicon gate electrode 294.

As described previously in the context of device 10, during subsequent fabrication processes, device 100 may be subjected to heat treatments involving elevated temperatures over pre-specified time intervals. These processes typically will include heating to reactively combine a subsequently deposited metal layer (not illustrated) with NFET and PFET silicon gate electrodes 250 and 294, respectively, to form an associated metal silicide gate electrode contact for each gate stack. If NFET silicide-forming metal caps are not used such as illustrated by gate stacks 204 and 208 in FIG. 20, one of two possible results is likely to occur. NFET doped silicon cap 238 and PFET doped silicon cap 286 may react with the subsequently formed metal layer to form doped metal silicide layers. This scenario may occur if overlying silicon gate electrodes 250 and 294 are completely reactively transformed into silicides. If the silicon gate electrodes are not fully transformed such as, for example, if these electrodes are thick, then NFET doped silicon cap 238 and PFET doped silicon cap 286 may remain in their respective gate stacks as unreacted, conductive doped silicon layers. A third result is likely to occur if silicide-forming metal caps 242 and 290 are included such as illustrated in FIG. 22 for gate stacks 210 and 220. In this case, NFET doped silicon cap 238 and PFET doped silicon cap 286 will react with silicide-forming metal caps 242 and 290, respectively, to form the associated metal silicides when subsequent heat treatments include exposure to temperatures in excess of about 400° C. for about 5 seconds or more. A portion of the doped silicon caps may remain as unreacted doped silicon if silicon from these cap layers is present in stoichiometric excess over metal species from the adjacent silicide-forming metal caps. Alternatively, silicon in such an excess may be consumed and transformed into doped metal silicide regions during the process of transforming silicon gate electrodes 250 and 294 into metal silicide gate contacts. Any metallic species from silicide-forming metal caps 242 and 290 present in stoichiometric excess over silicon from the respective doped-silicon caps, likely will react with silicon from silicon gate electrodes 250 and 294 and be transformed into a metal silicide. Layers comprising either doped silicon or preferably doped metal silicide interposed between metal-comprising gate electrodes 234 and 282 and silicon gate electrodes 250 and 294, respectively, have been experimentally found to lower the AC impedance of a gate stack.

Accordingly, the embodiments described herein provide novel methods for fabricating a semiconductor device having a doped silicon-comprising capping layer interposed between the metal and polycrystalline silicon gate electrode layers of a transistor gate stack. A doped silicon layer may be used alone or in conjunction with a silicide-forming metal capping layer interposed between the doped silicon capping layer and the polycrystalline silicon gate layer. When sufficiently heated during subsequent processing, the doped silicon layer may remain unreacted or may subsequently form a doped metal silicide either by reacting with the silicide-forming metal capping layer (if used), or by reacting with a subsequently formed metal layer used to form source/drain/gate silicide contacts. The resulting doped silicon or doped metal silicide capping layer bridges the interface between metal and polycrystalline silicon gate layers, effectively increasing the conductivity of this region and reducing interfacial defects believed to be a cause of undesirably high gate impedance. By reducing or eliminating such interfacial anomalies, metallic gate materials with their inherent performance advantages can be used more effectively in conjunction with polycrystalline silicon gates to provide further performance improvements. These advantages include compatible incorporation of high-k dielectric gate insulators, along with their inherently superior insulating properties, into a gate stack. Accordingly, these methods may be used in combination to fabricate PFET and NFET transistors on CMOS devices, or to fabricate individual PFET and NFET devices, and can be integrated into a conventional fabrication sequence to provide improved device performance.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for forming a semiconductor device comprising a semiconductor substrate, wherein the method comprises the steps of:
   forming a high dielectric constant layer overlying the semiconductor substrate;
   forming a metal-comprising gate layer overlying the high dielectric constant layer;
   forming an in situ doped silicon-comprising capping layer overlying the metal-comprising gate layer;
   forming a silicide-forming metal capping layer; and
   depositing a silicon-comprising gate layer overlying the in situ doped silicon-comprising capping layer and the silicide-forming metal capping layer, wherein the silicide-forming metal capping layer is interposed between the doped silicon-comprising capping layer and the silicon-comprising gate layer.

2. The method of claim 1, wherein the step of forming a silicide-forming metal capping layer comprises forming a silicide-forming metal capping layer comprising a metal selected from a group consisting of nickel (Ni), platinum (Pt), cobalt (Co), titanium (Ti), and a combination thereof.

3. The method of claim 2, wherein the step of forming a silicide-forming metal capping layer comprises forming a silicide-forming metal capping layer comprising nickel-platinum (NiPt).

4. The method of claim 3, wherein the step of forming a nickel-platinum (NiPt) layer comprises forming a nickel-platinum (NiPt) layer having a platinum (Pt) concentration of from about 5 atomic % to about 15 atomic %.

5. The method of claim 1, further comprising the step of heating the semiconductor substrate, the step of heating performed after the step of depositing.

6. The method of claim 1, further comprising the step of forming a gate insulator layer overlying the semiconductor substrate before the step of forming a high dielectric constant layer.

7. The method of claim 6, further comprising the step of forming a channel layer comprising a compressively-stressed monocrystalline layer.

8. The method of claim 6, further comprising the step of forming a channel layer comprising a tensile-stressed monocrystalline layer.

9. The method of claim 1, wherein the step of forming a doped silicon-comprising capping layer comprises forming a doped silicon-comprising capping layer comprising a doping element selected from a group consisting of boron (B), arsenic (As), phosphorous (P), and antimony (Sb).

10. The method of claim 1, wherein the step of forming a doped silicon-comprising capping layer comprises forming a doped silicon-comprising capping layer comprising a doping element having a concentration of from about $1\times10^{19}$ atom/cm$^3$ to about $1\times10^{20}$ atom/cm$^3$.

11. The method of claim 1, further comprising the step of forming a metal oxide gate capping layer interposed between the high dielectric constant layer and the metal-comprising gate layer.

12. A method of fabricating a semiconductor device on a semiconductor substrate having a first region and a second region, the method comprising the steps of:
    forming a channel layer comprising a compressively-stressed semiconductor material overlying the second region of the semiconductor substrate;
    forming a high dielectric constant layer overlying the first region of the semiconductor substrate and the channel layer;
    depositing a metal-comprising gate layer overlying the high dielectric constant layer;
    forming an in situ doped silicon capping layer overlying the metal-comprising gate layer;
    forming a silicide-forming metal capping layer;
    forming a silicon-comprising gate layer overlying the in situ doped silicon capping layer and the silicide-forming metal capping layer, wherein the silicide-forming metal capping layer is interposed between the in situ doped silicon capping layer and the silicon-comprising gate layer; and
    heating the substrate.

13. The method of claim 12, wherein the step of forming a silicide-forming metal capping layer comprises forming a silicide-forming metal capping layer comprising a metal selected from a group consisting of nickel (Ni), platinum (Pt), cobalt (Co), titanium (Ti), and a combination thereof.

14. The method of claim 12, further comprising the step of forming a metal oxide gate capping layer interposed between the high dielectric constant layer and the metal-comprising gate layer in the first region.

15. The method of claim 12, further comprising the step of forming a first metal-comprising layer interposed between the high dielectric constant layer and the metal-comprising gate layer in the second region.

16. The method of claim 12, wherein the step of heating the substrate comprises heating the substrate to a temperature of at least about 400° C. for more than about 5 seconds.

17. A semiconductor device having a gate stack overlying a semiconductor substrate, the gate stack comprising:
    a high dielectric constant layer disposed overlying the semiconductor substrate;
    a metal-comprising gate layer disposed overlying the high dielectric constant layer;
    a doped silicon capping layer disposed overlying the metal-comprising gate layer;
    a silicon-comprising gate layer overlying the doped silicon capping layer; and
    a silicide-forming metal capping layer interposed between the doped silicon-comprising capping layer and the silicon-comprising gate layer.

18. A method for forming a semiconductor device comprising a semiconductor substrate, wherein the method comprises the steps of:
    forming a high dielectric constant layer overlying the semiconductor substrate;

forming a metal-comprising gate layer overlying the high dielectric constant layer;

forming a doped silicon-comprising capping layer overlying the metal-comprising gate layer;

forming a silicide-forming metal capping layer overlying the doped silicon-comprising capping layer; and depositing a silicon-comprising gate layer overlying the doped silicon-comprising capping layer, wherein the silicide-forming metal capping layer is interposed between the doped silicon-comprising capping layer and the silicon-comprising gate layer.

19. The method of claim 18, wherein the step of forming a silicide-forming metal capping layer comprises forming a silicide-forming metal capping layer comprising a metal selected from a group consisting of nickel (Ni), platinum (Pt), cobalt (Co), titanium (Ti), and a combination thereof.

20. The method of claim 19, wherein the step of forming a silicide-forming metal capping layer comprises forming a silicide-forming metal capping layer comprising nickel-platinum (NiPt).

21. The method of claim 20, wherein the step of forming a nickel-platinum (NiPt) layer comprises forming a nickel-platinum (NiPt) layer having a platinum (Pt) concentration of from about 5 atomic % to about 15 atomic %.

22. A semiconductor device having a gate stack overlying a semiconductor substrate, the gate stack comprising:

a high dielectric constant layer disposed overlying the semiconductor substrate;

a metal-comprising gate layer overlying the high dielectric constant layer;

a doped silicon capping layer directly overlying and in contact with the metal-comprising gate layer;

a silicide-forming metal capping layer; and a silicon-comprising gate layer directly overlying the silicide-forming metal capping layer.

23. The semiconductor device of claim 22, wherein the silicide-forming metal capping layer is interposed between the doped silicon capping layer and the silicon-comprising gate layer.

* * * * *

UNITED STATES PATENT AND TRADEMARK OFFICE
CERTIFICATE OF CORRECTION

| | | |
|---|---|---|
| PATENT NO. | : 8,026,539 B2 | Page 1 of 1 |
| APPLICATION NO. | : 12/388094 | |
| DATED | : September 27, 2011 | |
| INVENTOR(S) | : Michael J. Hargrove et al. | |

It is certified that error appears in the above-identified patent and that said Letters Patent is hereby corrected as shown below:

Title Pg, and Col. 1, Line 2, Please correct the title as shown:

METAL OXIDE SEMICONDUCTOR DEVICES HAVING DOPED-SILICON-~~COMPROMISING~~COMPRISING CAPPING LAYERS AND METHODS FOR FABRICATING THE SAME

Signed and Sealed this
Sixth Day of December, 2011

David J. Kappos
*Director of the United States Patent and Trademark Office*